United States Patent
Zhao et al.

(10) Patent No.: US 11,398,193 B2
(45) Date of Patent: Jul. 26, 2022

(54) CONTROLLING BACKLIGHT DEVICE BASED ON SCAN STATE OF A GATE DRIVING CIRCUIT AND DRIVING METHOD THEREOF

(71) Applicants: ORDOS YUANSHENG OPTOELECTRONICS CO., LTD., Inner Mongolia (CN); BOE TECHNOLOGY GROUP CO., LTD., Beijing (CN)

(72) Inventors: Shuang Zhao, Beijing (CN); Jigang Sun, Beijing (CN); Jing Zhao, Beijing (CN)

(73) Assignees: ORDOS YUANSHENG OPTOELECTRONICS CO., LTD., Inner Mongolia (CN); BOE TECHNOLOGY GROUP CO., LTD., Beijing (CN)

( * ) Notice: Subject to any disclaimer, the term of this patent is extended or adjusted under 35 U.S.C. 154(b) by 363 days.

(21) Appl. No.: 16/330,481

(22) PCT Filed: Sep. 12, 2018

(86) PCT No.: PCT/CN2018/105129
§ 371 (c)(1),
(2) Date: Aug. 28, 2019

(87) PCT Pub. No.: WO2019/091204
PCT Pub. Date: May 16, 2019

(65) Prior Publication Data
US 2021/0383765 A1    Dec. 9, 2021

(30) Foreign Application Priority Data
Nov. 8, 2017    (CN) .......................... 201711092239.6

(51) Int. Cl.
G09G 3/34    (2006.01)
G09G 3/36    (2006.01)
H03K 19/21    (2006.01)

(52) U.S. Cl.
CPC ......... *G09G 3/3406* (2013.01); *G09G 3/3674* (2013.01); *G09G 2310/0237* (2013.01);
(Continued)

(58) Field of Classification Search
CPC .................................................. G09G 3/3406
(Continued)

(56) References Cited

U.S. PATENT DOCUMENTS 5,412,396 A    5/1995    Nelson
2003/0107407 A1    6/2003    Aikawa
(Continued)

FOREIGN PATENT DOCUMENTS

CN    101436393 A    5/2009
CN    101533617 A    9/2009
(Continued)

OTHER PUBLICATIONS

Search Report and Written Opinion for International Application No. PCT/CN2018/105129 dated Nov. 29, 2018.
(Continued)

*Primary Examiner* — Long D Pham
(74) *Attorney, Agent, or Firm* — Calfee, Halter & Griswold LLP

(57) ABSTRACT

A backlight control device, a backlight control method, and a display device that avoids image shake are described. The backlight control device comprises: a driving detection component that detects a scan state of a gate driving circuit of a display module and outputs a detection signal, and a
(Continued)

backlight control component that controls intermittent closing of a backlight between frames based to the detection signal.

15 Claims, 5 Drawing Sheets

(52) U.S. Cl.
CPC ............... *G09G 2310/0286* (2013.01); *G09G 2330/021* (2013.01); *H03K 19/21* (2013.01)

(58) Field of Classification Search
USPC ......................................................... 345/694
See application file for complete search history.

(56) References Cited

U.S. PATENT DOCUMENTS

| | | | |
|---|---|---|---|
| 2003/0170407 | A1 | 9/2003 | Okuyama et al. |
| 2006/0232544 | A1* | 10/2006 | Sakashita ............... G09G 3/342 345/102 |
| 2008/0012814 | A1 | 1/2008 | Kim |
| 2009/0231365 | A1 | 9/2009 | Yin |
| 2011/0012521 | A1* | 1/2011 | Byun ................... G09G 3/3406 315/186 |
| 2011/0279486 | A1 | 11/2011 | Kang |
| 2014/0015870 | A1* | 1/2014 | Takahashi ............ G09G 3/3406 345/691 |
| 2015/0348474 | A1 | 12/2015 | Li et al. |

FOREIGN PATENT DOCUMENTS

| | | |
|---|---|---|
| CN | 102243843 A | 11/2011 |
| CN | 101178881 B | 3/2012 |
| CN | 104021768 A | 9/2014 |
| JP | 2011-242211 | 12/2011 |

OTHER PUBLICATIONS

Search Report from European Patent Application No. 18849415.7 dated Jul. 21, 2021.

* cited by examiner

| trigger signal | D1 | Q1 | Q1 NOT | D2 | Q2 | Q2 NOT | output signal of XNOR gate |
|---|---|---|---|---|---|---|---|
| first stage scan signal ↑ | 1 | 1 | 0 | 1 | 1 | 0 | 1 |
| last stage scan signal ↓ | 0 | 1 | 0 | 0 | 0 | 1 | 0 |
| first stage scan signal ↑ | 0 | 0 | 1 | 1 | 0 | 1 | 1 |
| last stage scan signal ↓ | 1 | 0 | 1 | 1 | 1 | 0 | 0 |
| first stage scan signal ↑ | 1 | 1 | 0 | 0 | 1 | 0 | 1 |
| last stage scan signal ↓ | 0 | 1 | 0 | 0 | 0 | 1 | 0 |
| first stage scan signal ↑ | 0 | 0 | 1 | 1 | 0 | 1 | 1 |
| last stage scan signal ↓ | 1 | 0 | 1 | 1 | 1 | 0 | 0 |

| trigger signal | D1 | Q1 | Q1 NOT | D2 | Q2 | Q2 NOT | output signal of XOR gate |
|---|---|---|---|---|---|---|---|
| first stage scan signal ↑ | 1 | 1 | 0 | 0 | 0 | 1 | 1 |
| last stage scan signal ↓ | 0 | 1 | 0 | 1 | 1 | 0 | 0 |
| first stage scan signal ↑ | 0 | 0 | 1 | 0 | 1 | 0 | 1 |
| last stage scan signal ↓ | 1 | 0 | 1 | 0 | 0 | 1 | 0 |
| first stage scan signal ↑ | 1 | 1 | 0 | 1 | 0 | 1 | 1 |
| last stage scan signal ↓ | 0 | 1 | 0 | 1 | 1 | 0 | 0 |
| first stage scan signal ↑ | 0 | 0 | 1 | 0 | 1 | 0 | 1 |
| last stage scan signal ↓ | 1 | 0 | 1 | 0 | 0 | 1 | 0 |

CONTROLLING BACKLIGHT DEVICE BASED ON SCAN STATE OF A GATE DRIVING CIRCUIT AND DRIVING METHOD THEREOF

RELATED APPLICATIONS

This application is the U.S. national phase entry of PCT Application No. PCT/CN2018/105129, filed Sep. 12, 2018, which is based upon and claims priority to Chinese Patent Application No. 201711092239.6, filed on Nov. 8, 2017, the entire disclosure of which is incorporated herein by reference.

TECHNICAL FIELD

The present disclosure relates to the field of display technology, in particular to a backlight control device, a backlight control method, and a display device comprising the backlight control device.

BACKGROUND

Liquid crystal display (LCD) devices can be applied to various electronic devices. As LCD display devices are increasingly used in mobile devices such as mobile phones, requirements for their power consumption are getting higher and higher. Low-power LCD display devices can greatly improve the standby time and battery life of mobile devices such as mobile phones.

In the related art, the power consumption of the display device is generally reduced by reducing the refresh rate of the LCD display device. However, when the refresh rate of the LCD display device is lower than the resolution rate of the human eye, the screen of the LCD display device may appear to be shaken, thereby affecting the user experience.

SUMMARY

An object of the present disclosure is to provide a backlight control device, a backlight control method, and a display device comprising such a backlight control device, which overcome at least to some extent one or more problems due to limitations and defects of the related art.

According to an exemplary embodiment, a backlight control device is provided, comprising:

a driving detection component for detecting a scan state of a gate driving circuit of a display module and outputting a detection signal;

a backlight control component for controlling intermittent closing of a backlight between frames based on the detection signal.

In some exemplary embodiments of the backlight control device according to the present disclosure, the driving detection component comprises: a first edge-triggered flip flop and a second edge-triggered flip flop, wherein the first edge-triggered flip flop is used for outputting a first trigger signal to the backlight control component when a trigger terminal receives a first stage scan signal input to a first stage shift register of the gate driving circuit; and the second edge-triggered flip flop is used for outputting a second trigger signal to the backlight control component when the trigger terminal receives a last stage scan signal input to a last stage shift register of the gate driving circuit.

In some exemplary embodiments of the backlight control device according to the present disclosure, the backlight control component is configured to turn on the backlight when the first trigger signal is received; and to turn off the backlight when the second trigger signal is received.

In some exemplary embodiments of the backlight control device according to the present disclosure, the first edge-triggered flip flop is a rising edge D flip flop, the second edge-triggered flip flop is a falling edge D flip flop; and a D terminal of the rising edge D flip flop is connected to its Q NOT terminal, and a D terminal of the falling edge D flip flop is connected to its Q NOT terminal.

In some exemplary embodiments of the backlight control device according to the present disclosure, the backlight control component comprises: an XNOR gate, comprising a first input for receiving the first trigger signal, a second input for receiving the second trigger signal, and an output connected to a switch of the backlight, and wherein an initial state of the first edge-triggered flip flop is the same as that of the second edge-triggered flip flop.

In some exemplary embodiments of the backlight control device according to the present disclosure, the backlight control component comprises: an XOR gate, comprising a first input for receiving the first trigger signal, a second input for receiving the second trigger signal, and an output connected to a switch of the backlight, and wherein an initial state of the first edge-triggered flip flop is different from that of the second edge-triggered flip flop.

According to another exemplary embodiment, a backlight control method is provided, comprising:

detecting a scan state of a gate driving circuit of a display module and outputting a detection signal; and controlling intermittent closing of a backlight between frames based on the detection signal.

In some exemplary embodiments of the backlight control method according to the present disclosure, the step of detecting the scan state of the gate driving circuit and outputting the detection signal comprises:

receiving, by a first edge-triggered flip flop, a first stage scan signal input to a first stage shift register of the gate driving circuit, and outputting a first trigger signal when receiving the first stage scan signal;

receiving, by a second edge-triggered flip flop, a last stage scan signal input to a last stage shift register of the gate driving circuit and outputting a second trigger signal when receiving the last stage scan signal.

In some exemplary embodiments of the backlight control method according to the present disclosure, the step of detecting the scan state of the gate driving circuit and outputting the detection signal further comprises:

determining that the gate driving circuit enters a scan state when the first edge-triggered flip flop receives the first stage scan signal;

determining that the gate driving circuit enters a non-scan state when the second edge-triggered flip flop receives the last stage scan signal.

In some exemplary embodiments of the backlight control method according to the present disclosure, the first edge-triggered flip flop is a rising edge D flip flop and the second edge-triggered flip flop is a falling edge D flip flop; and a D terminal of the rising edge D flip flop is connected to its Q NOT terminal, and a D terminal of the falling edge D flip flop is connected to its Q NOT terminal.

In some exemplary embodiments of the backlight control method according to the present disclosure, the step of controlling intermittent closing of a backlight between frames based on the detection signal comprises: inputting the first trigger signal and the second trigger signal to two inputs of the XNOR gate and connecting the output of the XNOR gate to a switch of the backlight; and wherein an initial state of the first edge-triggered flip flop is the same as that of the second edge-triggered flip flop.

In some exemplary embodiments of the backlight control method according to the present disclosure, the step of controlling intermittent closing of a backlight between frames based on the detection signal comprises: inputting the first trigger signal and the second trigger signal to the two inputs of the XOR gate and connecting the output of the XOR gate to a switch of the backlight; and wherein an initial state of the first edge-triggered flip flop is different from that of the second edge-triggered flip flop.

According to another exemplary embodiment, a display device is provided, comprising a display module and the backlight control device according to some embodiments of the present disclosure as described herein.

It should be understood that the above general description and the following detailed description are only exemplary and illustrative and are not restrictive to the present disclosure.

BRIEF DESCRIPTION OF THE DRAWINGS

The drawings herein are incorporated in and constitute a part of the specification, and the drawings illustrate exemplary embodiments consistent with the present disclosure and are used for explaining the principles of the present disclosure together with the description. Obviously, the drawings in the following description are only some embodiments of the disclosure, and for those of ordinary skills in the art, other drawings can be obtained according to these drawings under the premise of not paying out creative work.

Figure 1:
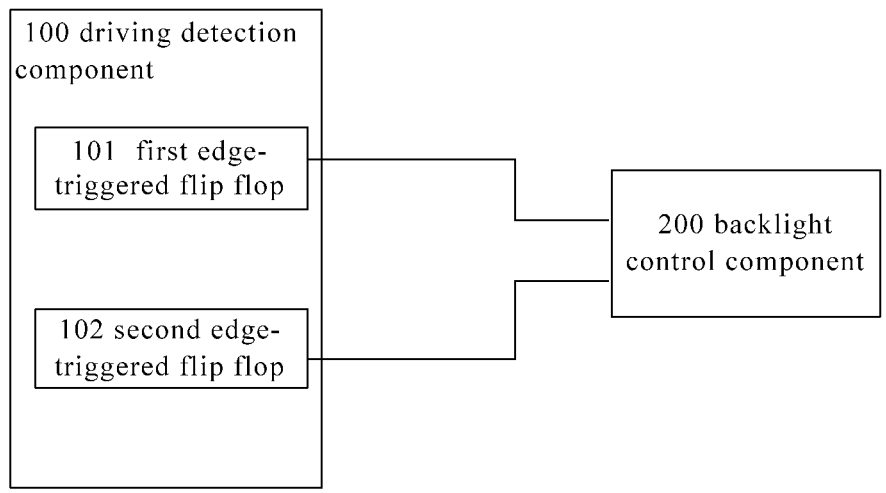
FIG. 1 schematically shows a structural block diagram of a backlight control device according to some embodiments of the present disclosure.

In addition, the drawings are merely schematic representations of the present disclosure and are not necessarily to scale. The same reference signs in the drawings represent the same or similar parts, and the repeated description thereof will be omitted. Some of the block diagrams shown in the drawings are functional entities and do not necessarily have to correspond to physically or logically separate entities.

DETAILED DESCRIPTION OF THE DISCLOSURE

Example exemplary embodiments will now be described more fully with reference to the drawings. However, the exemplary embodiments can be implemented in a variety of ways and should not be construed as being limited to the examples set forth herein; rather, these embodiments are provided so that this disclosure will be more comprehensive and complete, and the concepts of the exemplary embodiments are fully conveyed to those skilled in the art. The described features, structures, or characteristics may be combined in any suitable manner in one or more embodiments. In the following description, numerous specific details are provided to give a thorough understanding of exemplary embodiments of the present disclosure. However, those skilled in the art will appreciate that in the practice of the technical solution of the present disclosure, one or more of the specific details may be omitted or other methods, components, devices, steps, etc. may be employed. In other cases, well-known technical solutions are not specified or described in order to avoid obscuring various aspects of the disclosure.

FIG. 1 shows a structural block diagram of a backlight control device according to exemplary embodiments. As shown in FIG. 1, the backlight control device comprises: a driving detection component 100 and a backlight control component 200, wherein the driving detection component 100 is configured to detect a scan state of a gate driving circuit of a display module (not shown) and output a detection signal, and the backlight control component 200 is configured to control intermittent closing of a backlight (not shown) between frames based on the detection signal.

In the backlight control device according to some exemplary embodiments, the backlight is turned on or off by detecting whether the gate driving circuit of the display module is in a scan state: when the gate driving circuit of the display module is in a non-scan state, the backlight is turned off; when the gate driving circuit of the display module is in a scan state, the backlight is turned on. On the one hand, this is equivalent to inserting a black frame between two adjacent frames of the display module, thereby increasing the number of frames refreshed by the display module per unit time, and avoiding image shake of the display module at a low refresh rate. On the other hand, this reduces an illumination time of the backlight to the thin film transistor and reduces a leakage current of the thin film transistor, thereby further improving the image quality of the display module and avoiding image shake.

Next, how the driving detection component 100 detects whether the gate driving circuit of the display module is in a scan state is described in detail.

First, the scan principle of the gate driving circuit of the display module needs to be explained. The gate driving circuit of the display module comprises a plurality of cascaded shift registers, and an output of each shift register is connected to a gate of a thin film transistor of the display module and is connected to an input of a next stage shift register. At the beginning of a frame scan, a first stage shift register of the gate driving circuit receives a first stage scan signal, outputs a voltage that turn on the thin film transistor, and triggers a next stage shift register, so that the next stage shift register output the turn-on voltage at the next moment, and the scan finishes until the last stage shift register receives the last stage scan signal. Therefore, the gate driving circuit is in a scan state from the moment at which the first stage scan signal is sent to the end of the last scan signal, while the gate driving circuit is in a non-scanning state from the end of the last scanning signal to the initial scan state.

Therefore, the driving detection component 100 can determine whether the gate driving circuit is in the scan state by detecting the moment at which the first stage scan signal is sent and the end moment of the last stage scan signal.

As shown in FIG. 1, in some exemplary embodiments of the backlight control device, the driving detection component 100 may comprise: a first edge-triggered flip flop 101 and a second edge-triggered flip flop 102, wherein the first edge-triggered flip flop is configured to output a first trigger signal to the backlight control component 200 when a trigger terminal receives a first stage scan signal input to a first stage shift register of the gate driving circuit, the first trigger signal indicating that the gate driving circuit enters a scan state; and the second edge-triggered flip flop is configured to output a second trigger signal to the backlight control component 200 when the trigger terminal receives a last stage scan signal input to a last stage shift register of the gate driving circuit, the second trigger signal indicating that the gate driving circuit enters a non-scan state.

An edge-triggered flip flop is a type of flip flop that receives a signal at the receiving terminal and outputs it when receiving a certain transition of the trigger signal. For example, when the trigger signal of the trigger terminal continues to be a high level signal and a low level signal, the receiving terminal of the edge-triggered flip flop does not receive a signal; and when the trigger signal is converted from a high level signal to a low level signal or from a low level signal to a high level signal, the receiving terminal of the edge-triggered flip flop receives a signal and outputs it from the output. In some embodiments according to the present disclosure, the first edge-triggered flip flop 101 and the second edge-triggered flip flop 102 in the driving detection component 100 use the first stage scan signal and the last stage scan signal as the trigger signals that trigger the edge-triggered flip flops 101 and 102 to receive signals, so as to control output signals of the first and second edge-triggered flip flops 101 and 102 to determine the scan state of the gate driving circuit based on the output signals of the edge-triggered flip flops 101 and 102.

Moreover, it should be understood by those skilled in the art that the driving detection component 100 according to the exemplary embodiment can also detect whether the gate driving circuit is in a scan state by other alternative means, such as using a comparator or the like. These alternatives are all within the scope of the disclosure.

In some exemplary embodiments, the backlight control component 200 can control the turning on/off of the backlight based on the scan state of the gate driving circuit. More specifically, the backlight control component 200 is configured to turn on the backlight when receiving the first trigger signal output by the first edge-triggered flip flop 101 of the driving detection component 100, that is, when the gate driving circuit entering a scan state; and turn off the backlight when receiving the second trigger signal output by the second edge-triggered flip flop 102 of the driving detection component 100, that is, when the gate driving circuit entering the non-scan state. Thus, the backlight control device according to the present disclosure achieves turning on the backlight when the gate driving circuit is in the scan state and turning off the backlight when the gate driving circuit is in the non-scan state.

Figure 2:
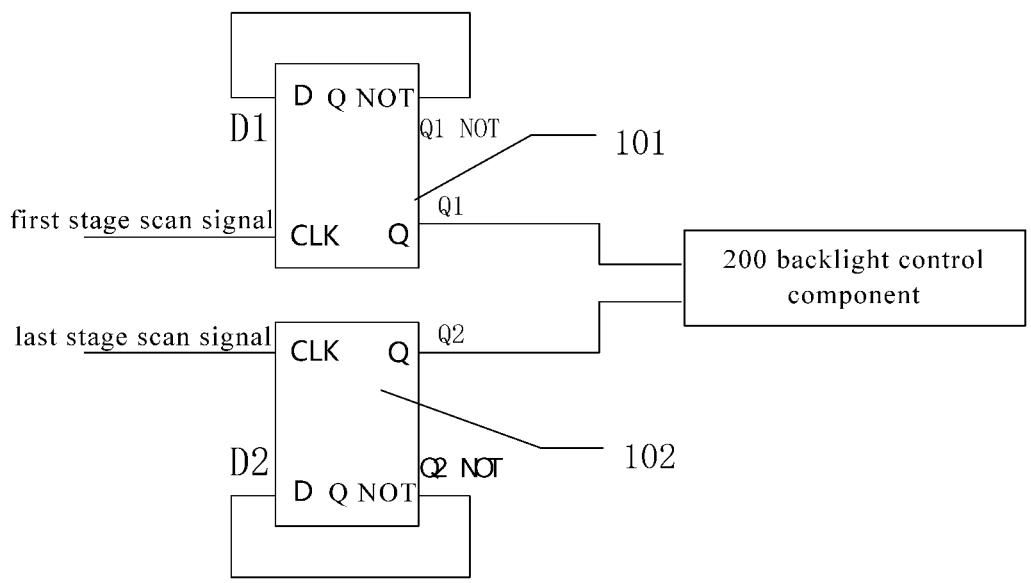
FIG. 2 schematically shows a circuit diagram of a backlight control device according to some embodiments of the present disclosure.

FIG. 2 shows a circuit diagram of a backlight control device according to some exemplary embodiments. As shown in FIG. 2, in the driving detection component 100, the first edge-triggered flip flop 101 can be a rising edge D flip flop 101, and the second edge-triggered flip flop 102 can be a falling edge D flip flop 102, wherein a D terminal (D1) of the first edge-triggered flip flop 101 is connected to its Q NOT terminal (Q1 NOT), and a D terminal (D2) of the second edge-triggered flip flop 102 is connected to its Q NOT terminal (Q2 NOT).

It should be noted that the rising edge D flip flop is a type of edge-triggered flip flop that receives a signal through the input and outputs it from the output when the level signal of the trigger terminal is at the rising edge from low level to high level; and the falling edge D flip flop is another type of edge-triggered flip flop that receives a signal through the input and outputs it from the output when the trigger terminal level signal is at the falling edge from high level to low level. Precisely, the scan starts when the first stage scan signal received by the first edge-triggered flip flop 101 is at the rising edge, and the scan ends when the last stage scan signal received by the second edge-triggered flip flop 102 is at the falling edge. Therefore, setting the first edge-triggered flip flop 101 as a rising edge D flip flop and setting the second edge-triggered flip flop 102 as a falling edge D flip flop can accurately determine the scan state of the gate driving circuit.

Figures 3, 4:
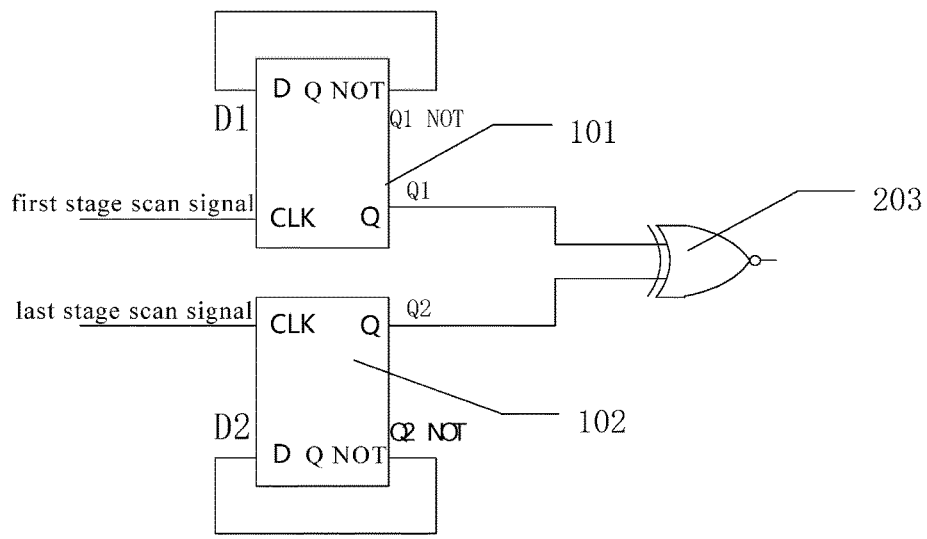
FIG. 3 schematically shows a circuit diagram of a backlight control device according to other embodiments of the present disclosure.
FIG. 4 is a truth table of the first and second edge D flip flops of FIG. 3.

FIG. 3 schematically shows a circuit diagram of a backlight control device according to other exemplary embodiments. As shown in FIG. 3, the backlight control component 200 can comprise an XNOR gate 203 that receives a first trigger signal at a first input and a second trigger signal at a second input, and its output is connected to a switch (not shown) of the backlight to control the turning on/off of the backlight. The XNOR gate is a basic unit of a digital logic circuit. The XNOR gate comprises two inputs and one output. When one and only one of the two inputs is at low level (logic 0), the output is low level. That is, when the input levels are the same, the output is high level (logic 1).

In the circuit diagram of the backlight control device according to some exemplary embodiments, as shown in FIG. 3, an initial state of the first edge-triggered flip flop 101 is the same as that of the second edge-triggered flip flop 102. It should be noted that the initial state of the first edge-triggered flip flop 101 being the same as that of the second edge-triggered flip flop 102 can be understood as: when the first edge-triggered flip flop 101 is first triggered, the output Q1 of the first edge-triggered flip flop 101 and the output Q2 of the second edge-triggered flip flop 102 is logically identical in level signal. In some embodiments according to the present disclosure, the description is made by taking "the level signals of the outputs of the first edge-triggered flip flop 101 and the second edge-triggered flip flop 102 are both logic 1" as an example.

Figure 5:
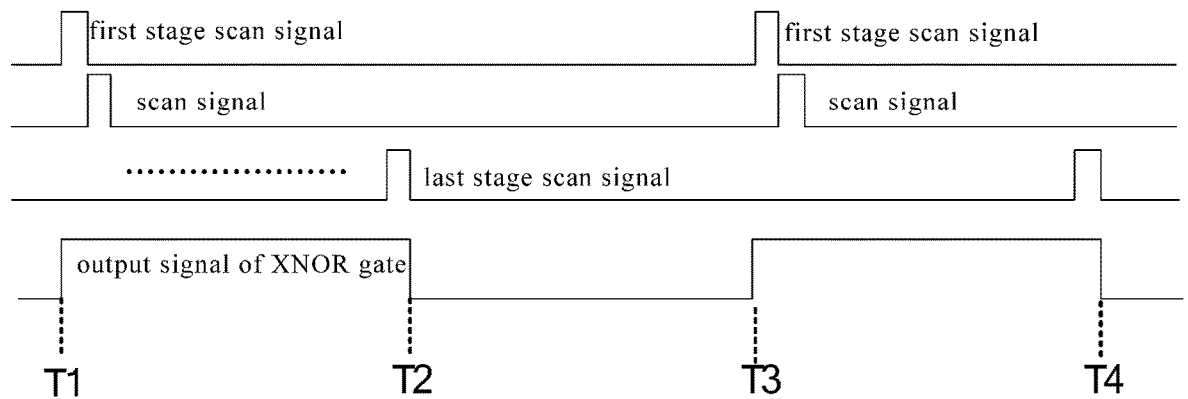
FIG. 5 is a timing diagram of the first and second edge D flip flops of FIG. 3.

FIG. 4 and FIG. 5 show a truth table and its timing diagram for the first edge-triggered flip flop 101 and the second edge-triggered flip flop 102 (i.e., the rising edge D flip flop and the falling edge D flip flop) shown in FIG. 3, respectively.

When the rising edge of the first stage scan signal arrives (time T1 in FIG. 5), as shown in the second row of FIG. 4, the level signals of the output Q1 and the input D1 of the rising edge D flip flop 101 are both logic 1, and the level signal of the Q1 NOT terminal is logic 0; the level signals of the output Q2 and the input D2 of the falling edge D flip flop 102 are both logic 1, and the level signal of the Q2 NOT terminal is logic 0. As shown in FIG. 3, the output Q1 of the rising edge D flip flop 101 and the output Q2 of the falling edge D flip flop 102 are respectively connected to the two inputs of the XNOR gate 203, and therefore, at the time T1, since the level signals of the output Q1 and the output Q2 are both logic 1, the output level signal of the XNOR gate 203 is logic 1, thereby turning on the backlight.

After the rising edge D flip flop 101 is triggered by the first stage scan signal, the input D1 of the rising edge D flip flop 101 receives the level signal of the Q1 NOT terminal and the level signal of the input D1 becomes logic 0, and the level signal of the output Q1 remains logic 1; the input D2 of the falling edge D flip flop 102 receives the level signal of the Q2 NOT terminal and the level signal of the input D2 becomes logic 0, and the level signal of the output Q2 remains logic 1.

When the falling edge D flip flop 102 is triggered by the falling edge of the last stage scan signal (time T2 in FIG. 5), as shown in the third row of FIG. 4, the state of the rising edge D flip flop 101 remains unchanged; the level signal of the output Q2 of the falling edge D flip flop 102 becomes logic 0 with the input D2, and the level signal of the Q2 NOT terminal become logic 1 opposite to that of Q2 terminal. Thus, at time T2, since the level signals of the output Q1 of the rising edge D flip flop 101 and the output Q2 of the falling edge D flip flop 102 are different, the output level signal of the XNOR gate 203 is logic 0, thereby turning off the backlight.

When the falling edge D flip flop 102 is triggered by the falling edge of the last stage scan signal, the input D2 receives the level signal of the Q2 NOT terminal and the level signal of the input D2 becomes logic 1, and the level signal of output Q2 remains logic 0; the state of the rising edge D flip flop 101 remains unchanged.

When the rising edge of the first stage scan signal of the next frame arrives (time T3 in FIG. 5), as shown in the fourth row of FIG. 4, the Q1 terminal of the rising edge D flip flop 101 becomes logic 0 with the level signal of the D1 terminal, the level signal of the Q1 NOT is logic 1; and the state of the falling edge D flip flop 102 remains unchanged. Thus, at time T3, since the level signals of Q1 and Q2 are both logic 0, the XNOR gate 203 outputs logic 1, thereby turning on the backlight.

After the rising edge D flip flop 101 is triggered by the first stage scan signal, the input D1 of the rising edge D flip flop 101 receives the level signal of the Q1 NOT terminal and the level signal of the input D1 becomes logic 1, and the level signal of the output Q1 remains logic 0; the state of the falling edge D flip flop 102 remains unchanged.

When the falling edge D flip flop 102 is triggered by the falling edge of the last stage scan signal (time T4 in FIG. 5), as shown in the fifth row of FIG. 4, the state of the rising edge D flip flop 101 remains unchanged; the level signal of the output Q2 of the falling edge D flip flop 102 becomes logic 1 with input D2, and level signal of the Q2 NOT terminal is logical 0 opposite to that of Q2 terminal. Thus, at time T4, since the level signals of the output Q1 and the output Q2 are different, the output level signal of the XNOR gate 203 is logic 0, thereby turning off the backlight.

Figure 6:
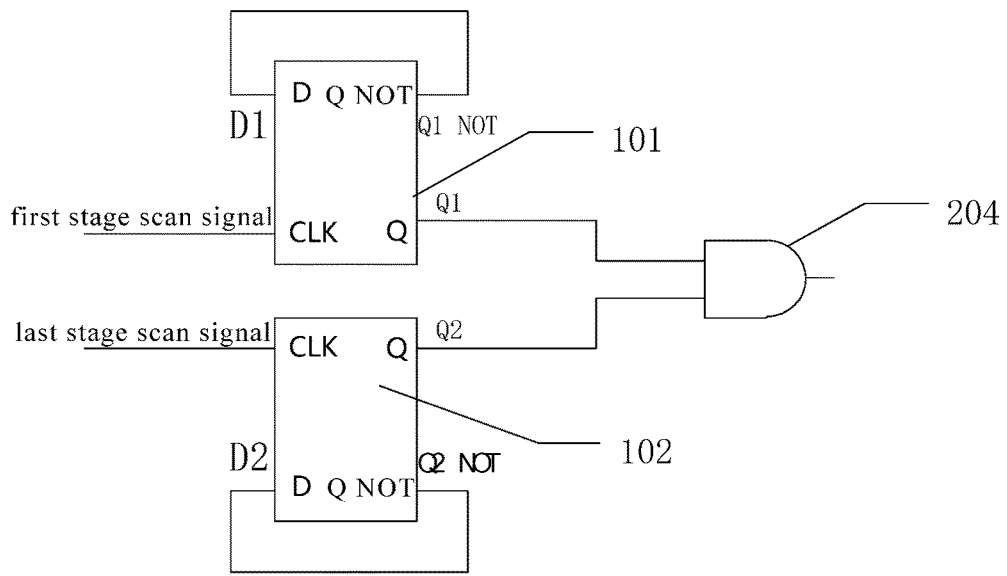
FIG. 6 schematically shows a circuit diagram of a backlight control device according to yet other embodiments of the present disclosure.

FIG. 6 shows a circuit diagram of a backlight control device according to yet other exemplary embodiments. As shown in FIG. 6, the backlight control component 200 comprises an XOR gate 204 that receives a first trigger signal at a first input and receives a second trigger signal at a second input, and its output is connected to a switch of the backlight to control the turning on/off of the backlight. The XOR gate is a basic unit of a digital logic circuit. The XOR gate has two inputs and one output. If the levels of the two inputs are different, the output is high level 1. If the two inputs are at the same level, the output is low level 0.

In contrast to FIG. 3, in the circuit diagram of the backlight control device according to the exemplary embodiment shown in FIG. 6, an initial state of the first edge-triggered flip flop 101 is different from that of the second edge-triggered flip flop 102. It should be noted that the initial state of the first edge-triggered flip flop 101 being different from that of the second edge-triggered flip flop 102 may be understood as: when the first edge-triggered flip flop 101 is first triggered, the outputs the first edge-triggered flip flop 101 and the second edge-triggered flip flop 102 are logically different in level signal, one of which is logic 1 and the other is logic 0. In some exemplary embodiments, the description is made by taking "the level signal of the output Q1 of the first edge-triggered flip flop 101 is logic 1 and the level signal of the output Q2 of the second edge-triggered flip flop 102 is logic 0" as an example.

Figures 7, 8:
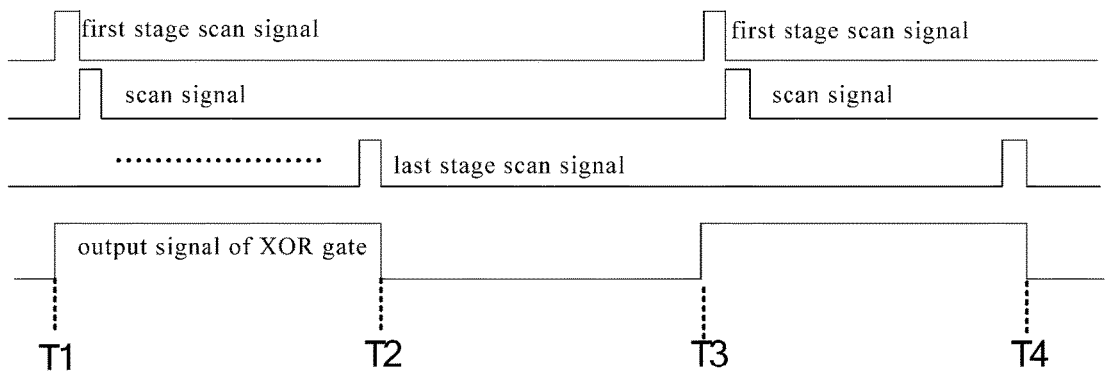
FIG. 7 is a truth table of the first and second edge D flip flops of FIG. 6.
FIG. 8 is a timing diagram of the first and second edge D flip flops of FIG. 6.

FIG. 7 and FIG. 8 show a truth table and its timing diagram for the first edge-triggered flip flop 101 and second edge-triggered flip flop 102 (i.e., the rising edge D flip flop and the falling edge D flip flop) shown in FIG. 6, respectively.

When the rising edge of the first stage scan signal arrives (time T1 in FIG. 8), as shown in the second row of FIG. 7, the level signals of the output Q1 and the input D1 of the rising edge D flip flop 101 are both logic 1, and the level signal of the Q1 NOT terminal is logic 0; the level signals of the input D2 and the output Q2 of the falling edge D flip flop 102 are both logic 0, and level signal of the Q2 NOT terminal is logic 1. As shown in FIG. 6, the output Q1 of the rising edge D flip flop 101 and the output Q2 of the falling edge D flip flop 102 are respectively connected to the two inputs of the XOR gate 204, and therefore, at time T1, since the level signals of the output Q1 and the output Q2 are different, the XOR gate 204 outputs logic 1, thereby turning on the backlight.

After the rising edge D flip flop 101 is triggered by the first stage scan signal, the input D1 of the rising edge D flip flop 101 receives the level signal of the Q1 NOT terminal and the level signal of the input D1 becomes logic 0, the level signal of the output Q1 remains logic 1; the input D2 of the falling edge D flip flop 102 receives the level signal of the Q2 NOT terminal and the level signal of the input D2 becomes logic 1, and the level signal of the output Q2 remains logic 0.

When the falling edge D flip flop 102 is triggered by the falling edge of the last stage scan signal (time T2 in FIG. 8), as shown in the third row of FIG. 7, the state of the rising edge D flip flop 101 remains unchanged; the level signal of the output Q2 of the falling edge D flip flops 102 becomes logic 1 with the input D2, and level signal of the Q2 NOT terminal is logic 0 opposite to that of Q2 terminal. Thus, at time T2, as shown in the third row of FIG. 7, since the level signals of the output Q1 and the output Q2 are the same, the output level signal of the XOR gate 204 is logic 0, thereby turning off the backlight.

After the falling edge D flip flop 102 is triggered by the falling edge of the last stage scan signal, the input D2 of the falling edge D flip flop 102 receives the level signal of the Q2 NOT terminal and the level signal of the input D2 becomes logic 0, and the level signal of the output Q2 remains logic 0; the state of the rising edge D flip flop 101 remains unchanged.

When the rising edge of the first stage scan signal of the next frame arrives (time T3 in FIG. 8), as shown in the fourth row of FIG. 7, the Q1 terminal of the rising edge D flip flop 101 becomes logic 0 with the D1 terminal, and Q1 NOT is logic 1; the state of the falling edge D flip flop 102 remains unchanged. Therefore, at time T3, as shown in the fourth row of FIG. 7, since the output level signals of Q1 and Q2 are different, the XOR gate 204 outputs logic 1, thereby turning on the backlight.

After the rising edge D flip flop 101 is triggered by the first stage scan signal, the input D1 of the rising edge D flip flop 101 receives the level signal of the Q1 NOT terminal and the level signal of the input D1 becomes logic 1, the level signal of the output Q1 remains logic 0; the state of the falling edge D flip flop 102 remains unchanged.

When the falling edge D flip flop 102 is triggered by the falling edge of the last stage scan signal (time T4 in FIG. 8), as shown in the fifth row of FIG. 7, the state of the rising edge D flip flop 101 remains unchanged; the level signal of the output Q2 of the falling edge D flip flop 102 becomes logic 0 with input D2, and the Q2 NOT terminal is logic 1 opposite to the Q2 terminal. Thus, at time T4, as shown in the fifth row of FIG. 7, since the level signals of the output Q1 and the output Q2 are the same, the output level signal of the XOR gate 204 is logic 0, thereby turning off the backlight.

Figure 9:
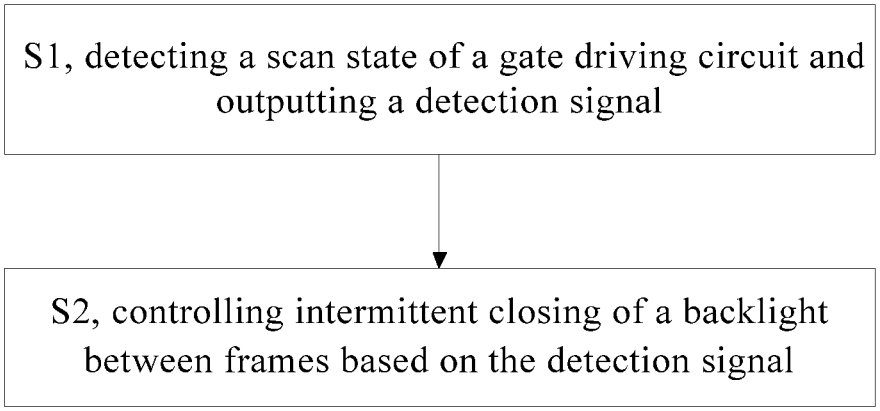
FIG. 9 shows a flow chart of a backlight control method according to some embodiments of the present disclosure.

FIG. 9 shows a flow chart of a backlight control method according to an exemplary embodiment. As shown in FIG. 9, a backlight control method according to some embodiments of the present disclosure comprises:

Step S1: detecting a scan state of a gate driving circuit of a display module and outputting a detection signal;

Step S2: controlling intermittent closing of a backlight between frames based on the detection signal.

In some exemplary embodiments of the backlight control method, the step S1-detecting the scan state of the gate driving circuit and outputting the detection signal may comprise:

receiving, by a first edge-triggered flip flop, a first stage scan signal input to a first stage shift register of the gate driving circuit, and outputting a first trigger signal; and receiving, by a second edge-triggered flip flop, a last stage scan signal input to a last stage shift register of the gate driving circuit and outputting a second trigger signal.

In some exemplary embodiments of the backlight control method, the step S1-detecting the scan state of the gate driving circuit and outputting the detection signal may comprise:

determining that the gate driving circuit enters a scan state when the first edge-triggered flip flop receives the first stage scan signal; and determining that the gate driving circuit enters a non-scan state when the second edge-triggered flip flop receives the last stage scan signal.

In some exemplary embodiments of the backlight control method, the first edge-triggered flip flop is a rising edge D flip flop, and the second edge-triggered flip flop is a falling edge D flip flop; wherein a D terminal of the first edge-triggered flip flop is connected to its Q NOT terminal and a D terminal of the second edge-triggered flip flop is connected to its Q NOT terminal.

In some exemplary embodiments of the backlight control method, step S2-controlling intermittent closing of the backlight between frames based on the detection signal may comprise:

inputting the first trigger signal and the second trigger signal to two inputs of the XNOR gate and connecting the output of the XNOR gate to a switch of the backlight; and wherein an initial state of the first edge-triggered flip flop is the same as that of the second edge-triggered flip flop.

In some exemplary embodiments of the backlight control method, step S2-controlling intermittent closing of the backlight between frames based on the detection signal may further comprise:

inputting the first trigger signal and the second trigger signal to the two inputs of the XOR gate and connecting the output of the XOR gate to a switch of the backlight; and wherein an initial state of the first edge-triggered flip flop is different from that of the second edge-triggered flip flop.

The backlight control method according to exemplary embodiments has the same or similar technical features as the above-described backlight control device, and details are not described herein again.

According to another exemplary embodiment, a display device is provided, comprising a display module and the backlight control device according to the exemplary embodiments described above.

After reading and practicing the specification, other exemplary embodiments will be apparent to those skilled in the art. The application is intended to cover any variations, uses, or adaptations of the present disclosure, which are consist with the general principles of the present disclosure and comprise common knowledge or conventional technical means in the art. The specification and described embodiments are only exemplary, the real scope and spirit of the disclosure is defined by the appended claims.

The features, structures, or characteristics described above may be combined in any suitable manner in one or more embodiments, and the features discussed in the various embodiments are interchangeable, if possible. In the description above, numerous specific details are set forth to provide a thorough understanding of the embodiments of the disclosure. However, those skilled in the art will appreciate that the technical solutions of the present disclosure may be practiced without one or more of the specific details, or other methods, components, materials, and the like may be used. In other cases, well-known structures, materials or operations are not shown or described in detail to avoid obscuring aspects of the present disclosure.

The words "a", "an", "the" and "said" are used in the specification to indicate the presence of one or more elements or components, etc. The words "comprise" or "include" is an open-ended term and means that there may be additional elements or components, etc. in addition to the listed elements or components, etc.; the words "first" and "second" etc. are used only as marks, not limit to quantity.

What is claimed is:

1. A backlight control device, comprising:
   a driving detection circuit for detecting a scan state of a gate driving circuit of a display module and output a detection signal; and
   a backlight control circuit for controlling intermittent closing of a backlight between frames based on the detection signal,
   wherein the driving detection circuit comprises:
   a first edge-triggered flip flop for outputting a first trigger signal to the backlight control circuit when a trigger terminal receives a first stage scan signal input to a first stage shift register of the gate driving circuit; and
   a second edge-triggered flip flop for outputting a second trigger signal to the backlight control circuit when the trigger terminal receives a last stage scan signal input to a last stage shift register of the gate driving circuit.

2. The backlight control device according to claim 1, wherein
   the backlight control circuit is configured to turn on the backlight when the first trigger signal is received; and to turn off the backlight when the second trigger signal is received.

3. The backlight control device according to claim 2, wherein
the first edge-triggered flip flop is a rising edge D flip flop, the second edge-triggered flip flop is a falling edge D flip flop; and
a D terminal of the rising edge D flip flop is connected to its Q NOT terminal, and
a D terminal of the falling edge D flip flop is connected to its Q NOT terminal.

4. The backlight control device according to claim 1, wherein the backlight control circuit comprises:
an XNOR gate, comprising a first input for receiving the first trigger signal, a second input for receiving the second trigger signal, and an output connected to a switch of the backlight,
and wherein an initial state of the first edge-triggered flip flop is the same as that of the second edge-triggered flip flop.

5. The backlight control device according to claim 1, wherein the backlight control circuit comprises:
an XOR gate, comprising a first input for receiving the first trigger signal, a second input for receiving the second trigger signal, and an output connected to a switch of the backlight,
and wherein an initial state of the first edge-triggered flip flop is different from that of the second edge-triggered flip flop.

6. A backlight control method, comprising:
detecting a scan state of a gate driving circuit of a display module and outputting a detection signal; and
controlling intermittent closing of a backlight between frames based on the detection signal,
wherein the detecting the scan state of the gate driving circuit and outputting the detection signal comprises:
receiving, by a first edge-triggered flip flop, a first stage scan signal input to a first stage shift register of the gate driving circuit, and outputting a first trigger signal when receiving the first stage scan signal;
receiving, by a second edge-triggered flip flop, a last stage scan signal input to a last stage shift register of the gate driving circuit, and outputting a second trigger signal when receiving the last stage scan signal.

7. The backlight control method according to claim 6, wherein the detecting the scan state of the gate driving circuit and outputting the detection signal further comprises:
determining that the gate driving circuit enters a scan state when the first edge-triggered flip flop receives the first stage scan signal;
determining that the gate driving circuit enters a non-scan state when the second edge-triggered flip flop receives the last stage scan signal.

8. The backlight control method according to claim 6, wherein the first edge-triggered flip flop is a rising edge D flip flop, the second edge-triggered flip flop is a falling edge D flip flop; and
a D terminal of the rising edge D flip flop is connected to its Q NOT terminal, and a D terminal of the falling edge D flip flop is connected to its Q NOT terminal.

9. The backlight control method according to claim 6, wherein the controlling intermittent closing of a backlight between frames based on the detection signal comprises:
inputting the first trigger signal and the second trigger signal to two inputs of the XNOR gate and connecting the output of the XNOR gate to a switch of the backlight; and
an initial state of the first edge-triggered flip flop is the same as that of the second edge-triggered flip flop.

10. The backlight control method according to claim 6, wherein the controlling intermittent closing of a backlight between frames based on the detection signal comprises:
inputting the first trigger signal and the second trigger signal to the two inputs of the XOR gate and connecting the output of the XOR gate to a switch of the backlight; and
an initial state of the first edge-triggered flip flop is different from that of the second edge-triggered flip flop.

11. A display device, comprising a display module and a backlight control device, the backlight control device comprising:
a driving detection circuit for detecting a scan state of a gate driving circuit of the display module and output a detection signal; and
a backlight control circuit for controlling intermittent closing of a backlight between frames based on the detection signal,
wherein the driving detection circuit comprises:
a first edge-triggered flip flop for outputting a first trigger signal to the backlight control circuit when a trigger terminal receives a first stage scan signal input to a first stage shift register of the gate driving circuit; and
a second edge-triggered flip flop for outputting a second trigger signal to the backlight control circuit when the trigger terminal receives a last stage scan signal input to a last stage shift register of the gate driving circuit.

12. The display device according to claim 11, wherein the backlight control circuit is configured to turn on the backlight when the first trigger signal is received; and to turn off the backlight when the second trigger signal is received.

13. The display device according to claim 12, wherein
the first edge-triggered flip flop is a rising edge D flip flop, the second edge-triggered flip flop is a falling edge D flip flop; and
a D terminal of the rising edge D flip flop is connected to its Q NOT terminal, and
a D terminal of the falling edge D flip flop is connected to its Q NOT terminal.

14. The display device according to claim 11, wherein the backlight control circuit comprises:
an XNOR gate, comprising a first input for receiving the first trigger signal, a second input for receiving the second trigger signal, and an output connected to a switch of the backlight,
and wherein an initial state of the first edge-triggered flip flop is the same as that of the second edge-triggered flip flop.

15. The display device according to claim 11, wherein the backlight control circuit comprises:
an XOR gate, comprising a first input for receiving the first trigger signal, a second input for receiving the second trigger signal, and an output connected to a switch of the backlight,
and wherein an initial state of the first edge-triggered flip flop is different from that of the second edge-triggered flip flop.

* * * * *